(12) United States Patent
Tamada et al.

(10) Patent No.: US 7,835,187 B2
(45) Date of Patent: Nov. 16, 2010

(54) BOOSTING SEED VOLTAGE FOR A MEMORY DEVICE

(75) Inventors: Satoru Tamada, Kamakura (JP); Neal R Mielke, Los Altos Hills, CA (US); Krishna Parat, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 139 days.

(21) Appl. No.: 12/262,410

(22) Filed: Oct. 31, 2008

(65) Prior Publication Data

US 2010/0110795 A1    May 6, 2010

(51) Int. Cl.
*G11C 11/34* (2006.01)

(52) U.S. Cl. .............................. 365/185.19; 365/185.24

(58) Field of Classification Search ............ 365/185.19, 365/185.24
See application file for complete search history.

(56) References Cited

U.S. PATENT DOCUMENTS

| | | | |
|---|---|---|---|
| 7,064,980 B2 * | 6/2006 | Cernea et al. | 365/185.11 |
| 2007/0297234 A1 * | 12/2007 | Cernea et al. | 365/185.18 |

* cited by examiner

*Primary Examiner*—Michael T Tran
(74) *Attorney, Agent, or Firm*—Cool Patent, P.C.; Joseph P. Curtin

(57) ABSTRACT

A method and device using bitline-bitline capacitance between adjacent bitlines to boost seed voltage in a memory device are provided. The method may include a precharge phase, a boost phase, an equalize phase, and a lock in phase. In one embodiment, the method may include boosting the seed voltage twice. The bitlines may be divided into one or more segments.

18 Claims, 8 Drawing Sheets

|  | BL1,SegA 802 | BL2,SegA 804 | BL1,SegB 806 | BL2,SegB 808 |
|---|---|---|---|---|
| Precharge 810 | Vcc 812 | ground 814 | ground 816 | ground 818 |
| 1st Boost 820 | boosted 822 | Vcc 824 | ground 826 | Vcc 828 |
| 2nd Boost 830 | twice boosted 832 | boosted 834 | Vcc 836 | boosted 838 |
| Equalize 840 | equalized 842 | equalized 844 | Vcc, ground, or other V 846 | Vcc, ground, or other V 848 |

BOOSTING SEED VOLTAGE FOR A MEMORY DEVICE

BACKGROUND

Flash memory commonly uses Fowler-Nordheim tunneling for programming memory cells. The tunneling current is dependent on the voltage gap between the control gate and a channel region. When programming memory cells, a program voltage is applied to a wordline containing memory cells being programmed and other cells which are to be inhibited from programming. Program disturb occurs when programming of memory cells causes an inhibited memory cell on the same wordline to become inadvertently programmed.

In NAND flash, a program-inhibit scheme commonly referred to as self boosting may be utilized to enhance channel level and source/drain region in cells that are to be inhibited from programming. A seed voltage is placed on the inhibited bitlines to provide an initial voltage to the channel/source/drain region. Self boost applies elevated voltage to the deselected wordlines to increase the voltage in the channel/source/drain region above the initial voltage, using capacitive coupling between the wordlines and the channel/source/drain. The efficiency of the coupling depends on the boosting ratio (ratio of the capacitance between wordline and channel/source/drain to the capacitance between wordline and the bottom of the depletion region below the channel/source/drain). As NAND technology scaling proceeds, the boosting ratio decreases due to the increase of parasitic capacitance.

BRIEF DESCRIPTION OF THE DRAWINGS

The claimed subject matter will be understood more fully from the detailed description given below and from the accompanying drawings of disclosed embodiments which, however, should not be taken to limit the claimed subject matter to the specific embodiment(s) described, but are for explanation and understanding only.

DETAILED DESCRIPTION

Figure 1:
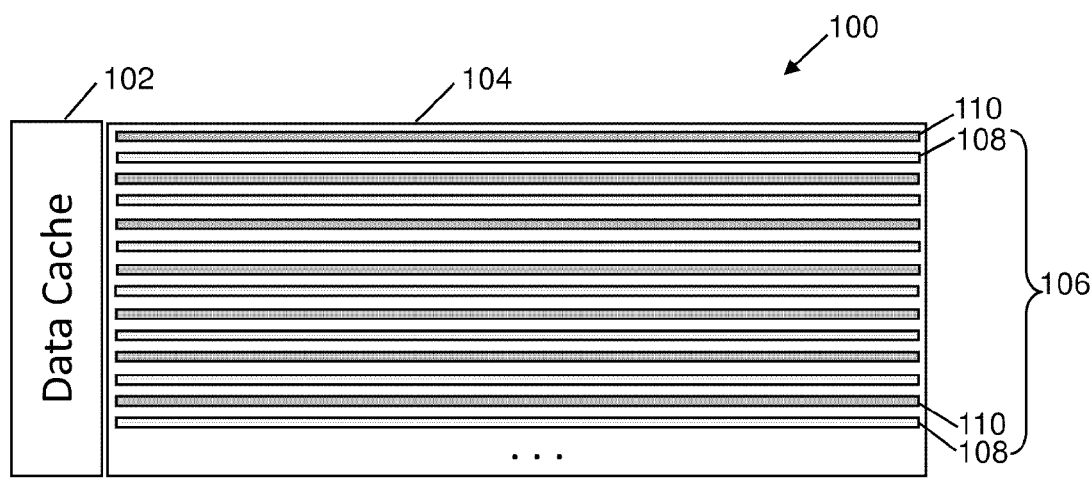
FIG. 1 is a simplified block diagram of a non-volatile memory device according to one embodiment.

Referring to FIG. 1, a simplified block diagram of a non-volatile memory device 100 is shown according to one embodiment. Memory device 100 may include a data cache 102 coupled to a memory array 104 capable of storing data. Memory array 104 may include wordlines (not shown) and bitlines 106 capable of accessing data from the memory array 104. Memory device 100 is depicted with a NAND flash memory array 104, which is an erasable and programmable non-volatile memory. The memory array 104 may include memory cells organized in blocks, pages, and strings. Memory cells may be individually programmed and read. During program and read operations, pages of data move in and out of data cache 102. For example, there may be 2,048 blocks in a 2 gigabyte NAND memory device with 64 pages of data per block. Other flash memory architectures are also within the scope of the claimed subject matter.

Memory device 100 may include other types of non-volatile memory. Further, memory device 100 may be formed and manufactured using MOS (metal oxide semiconductor) technology, CMOS (complementary MOS) technology, BiCMOS (bipolar CMOS) technology, or other semiconductor manufacturing technologies suitable for forming memory. However, these are merely examples of the different types of memory device 100, and the scope of the claimed subject matter is not limited in these respects.

During programming of memory device 100, memory cells on a wordline that are not being programmed are inhibited from programming. Those of bitlines 106 which are coupled to memory cells being programmed will be herein referred to as "programmed bitlines," whereas those bitlines 106 which are coupled to inhibited cells will be referred to herein as "inhibited bitlines." Inhibited bitlines may become programmed bitlines, and programmed bitlines may become inhibited bitlines, at different times of operation of memory device 100.

Bitlines may be considered to have odd parity or even parity. For example, bitline 108 of the memory array 104 may be considered even, then the next one odd, the next one even, and so forth. For example, memory array 104 is shown with alternating even bitlines 108 and odd bitlines 110.

Bitlines, as referred to herein, may include one or more segments. Memory device 100 may include one or more segment data handlers including circuitry capable of coupling one or more segments together, as further described below.

A wordline may contain one or more pages. In one embodiment, there may be two pages per wordline in which bitlines of the first page alternate with bitlines of the second page. In a particular embodiment, a wordline may include one odd page containing bitlines of odd parity and one even page containing bitlines of even parity, with alternating even and odd bitlines. In one embodiment, there may be only one page per wordline, so that the one page per wordline contains bitlines of both even parity and odd parity. In an embodiment with more than two pages per wordline, the bitlines may be divided between odd bitlines and even bitlines regardless of page. In one embodiment, a multi-level cell (MLC) NAND flash may include two or more pages per wordline with memory cells each belonging to two or more different pages, each page sharing bitlines. Other arrangements may be feasible, and the scope of the claimed subject matter is not limited in these respects.

Figure 1A:
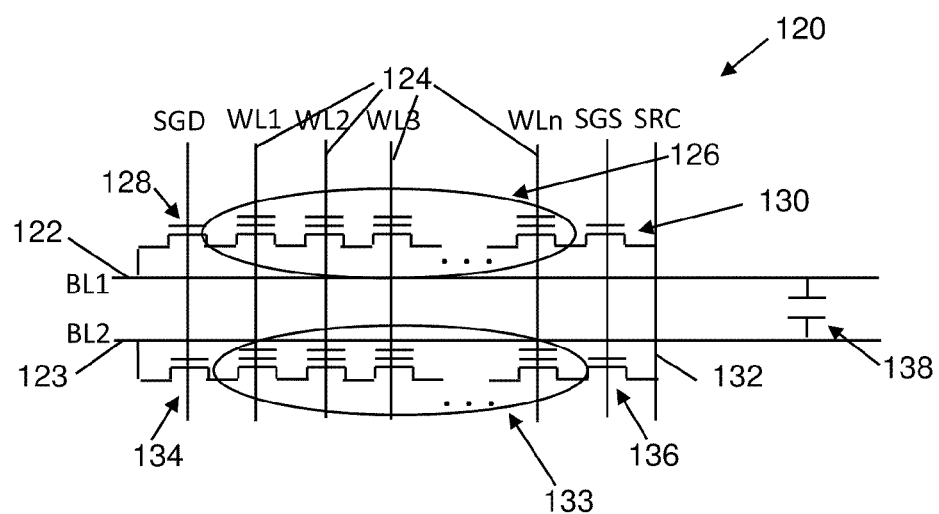
FIG. 1A is a schematic diagram of an exemplary portion of two adjacent bitlines of FIG. 1 according to one embodiment.

Referring now to FIG. 1A, a schematic diagram of an exemplary portion of bitlines 106 of memory array 104 of FIG. 1 is shown at 120. FIG. 1A shows two adjacent bitlines 122 (herein referred to as "BL1") and 123 (herein referred to as "BL2") and wordlines 124 capable of accessing data in memory array 104. Bitline BL1 is coupled with a string 126 of memory cells serially connected between a select gate drain (SGD) device 128 and a select gate source (SGS) device 130 coupled with a source line (SRC) 132. Similarly, bitline BL2 is coupled with a string 133 of memory cells serially connected between an SGD device 134 and an SGS device 136 also coupled with SRC 132. Although not shown, additional strings of memory cells may be coupled to bitlines BL1 and BL2.

A capacitance 138 may arise naturally from the proximity of and/or the size of bitlines BL1 and BL2, and/or the nature of the dielectric between bitlines BL1 and BL2. As used herein, capacitance may be a numerical quantity and not necessarily a separate physical element. Other terms herein such as "bitline-bitline capacitance," "bitline-bitline coupling," "capacitively coupled," and "capacitive coupling" may also refer to capacitance between adjacent bitlines.

Figure 2:
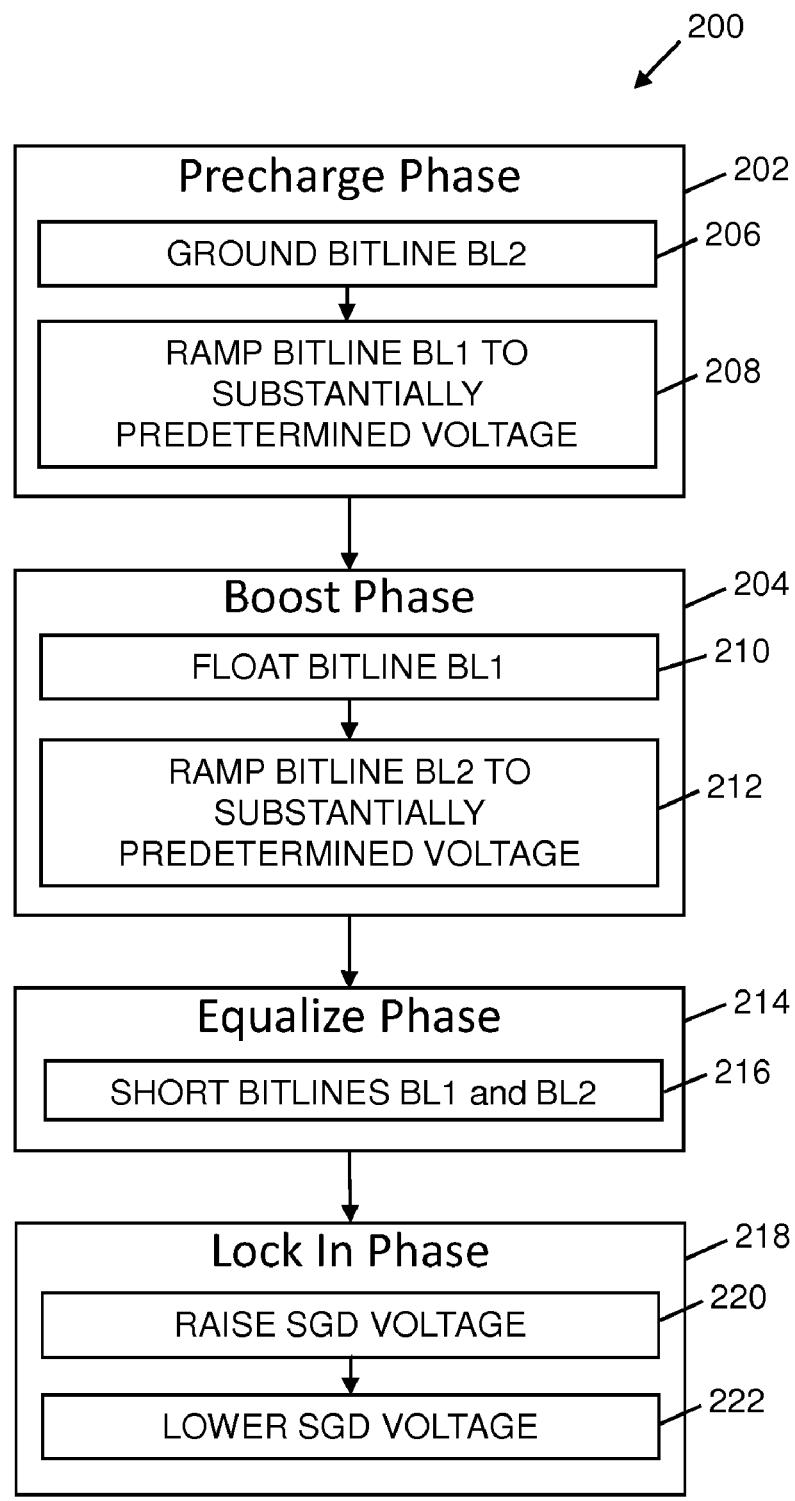
FIG. 2 is a flowchart of a method for use in a non-volatile memory device according to one embodiment.

In FIG. 2, a flowchart of a method for use in a non-volatile memory device according to one embodiment is shown at 200. For example, method 200 may be used with the memory device 100 shown in FIG. 1. In one embodiment, method 200 may increase a seed voltage on bitline BL1. A higher seed voltage may be useful in achieving a higher channel/source/drain voltage to decrease program disturb of a non-programmed memory cell on bitline BL1. Method 200 may include a precharge phase 202, a boost phase 204, an equalize phase 214, and a lock-in phase 218.

Precharge phase 202 may include, at 206, grounding bitline BL2. Precharge phase 202 may also include, at 208, ramping bitline BL1 to substantially a predetermined voltage. As used herein, the predetermined voltage may be a supply voltage, such as Vcc=3 V or any acceptable preset voltage. "Substantially" herein refers to an actual voltage being at or approximate the predetermined voltage. It is noted that the predetermined voltage may not necessarily refer to the same value throughout the entirety of this disclosure. The scope of the claimed subject matter is not limited in these respects.

Boost phase 204 may be capable of increasing voltage in the bitline BL1 by use of the capacitance 138 of FIG. 1A between the two bitlines BL1 and BL2. Boost phase 204 may include floating bitline BL1 at 210. Floating a bitline herein may involve decoupling the bitline from a predetermined voltage (such as ground, Vcc, or other preset voltage). Boost phase 204 may further include, at 212, ramping bitline BL2 to substantially the predetermined voltage. When bitline BL2 is raised in voltage, the capacitance between bitlines BL2 and BL1 may cause the voltage of bitline BL1 to be raised as well. The voltage of bitline BL1 may result in a higher voltage than was achieved in the precharge phase 202. The higher voltage may be referred to as "boosted voltage," further, method 200 may include preventing bitlines BL1 and/or BL2 from falling below the predetermined voltage, such as by the use of pull-up devices.

According to one embodiment, method 200 may include an equalize phase 214 for allowing the bitlines BL1 and BL2 to share charge. At 216, the bitlines BL1 and BL2 may be shorted. The voltage of bitline BL1 may fall from a boosted value obtained from box 204 and the voltage of bitline BL2 rises from a substantially predetermined value of box 212. Both the voltage of bitline BL1 and the voltage of bitline BL2 equalize at an intermediate value, which may be higher than the predetermined voltage.

In one embodiment, method 200 may include a lock-in phase 218. Locking in a seed voltage (also herein referred to as "lock-in") may be useful in preparation for inhibiting bitline BL1. Lock-in refers to passing a seed voltage into the source/drain/channel regions of a string that is to be inhibited. Lock-in may further include biasing an SGD device in such a way that a voltage passed into the string may be maintained even if the bitline voltage is lowered. At 220, lock in phase 218 may include raising the voltage at SGD device 128 of FIG. 1A (also referred to herein as "SGD voltage") to at least a voltage sufficiently high such that the SGD device 128 passes the bitline voltage through from its drain (coupled to the bitline BL1) to its source (coupled to the string 126).

At 222, lock-in phase 218 may further include lowering the SGD voltage to at most a voltage sufficiently low to prevent the SGD device 128 from pulling down the voltage of string 126 if the bitline voltage is lowered from the boosted value resulting from box 210 or the intermediate value resulting from the equalize phase 214. If bitline BL2 is a programmed bitline, the voltage of bitline BL2 is lowered to ground or other predetermined value during programming, which may result in the voltage of bitline BL1 being lowered due to the capacitance between the bitlines BL1 and BL2. Lowering the SGD voltage at 222 may prevent the voltage of string 126 (which is coupled to bitline BL1 through SGD) from being lowered.

Method 200 describes the biasing of two adjacent bitlines BL1 and BL2 according to one embodiment. To apply the method 200, as described above, to the memory array 104 of FIG. 1, the relationship between bitlines BL1 and BL2 may be replicated across multiple bitlines. In one embodiment, all even bitlines may be biased as bitline BL1, and all odd bitlines may be biased as bitline BL2. In one embodiment, all bitlines corresponding to a page being programmed may be biased as bitline BL2, and all bitlines corresponding to a page of opposite parity may be biased as bitline BL1. The scope of the claimed subject matter is not limited in these respects.

Figure 10:
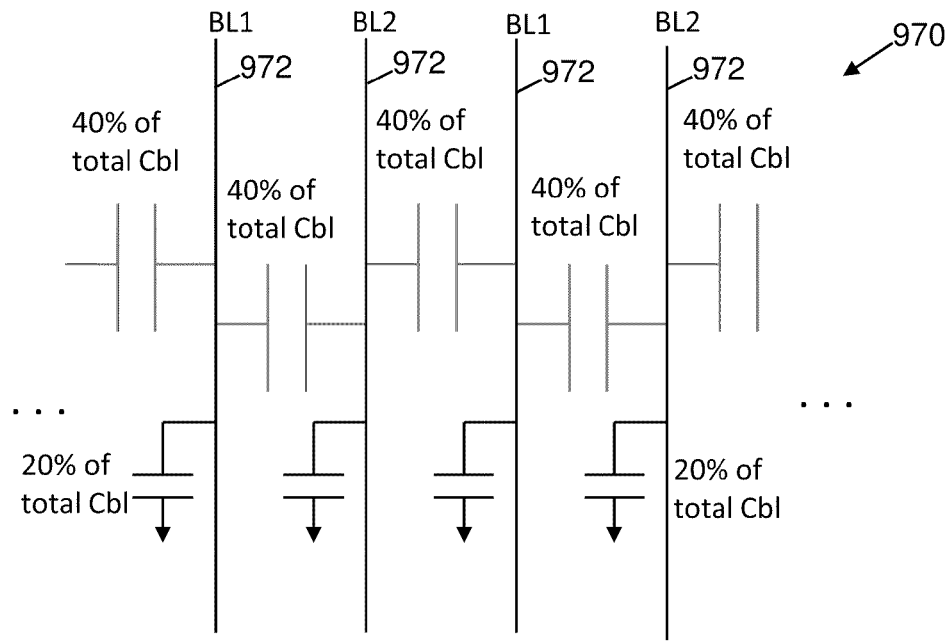
FIG. 10 is a schematic diagram corresponding to FIG. 1 for estimation purposes according to one embodiment.
Figure 11:
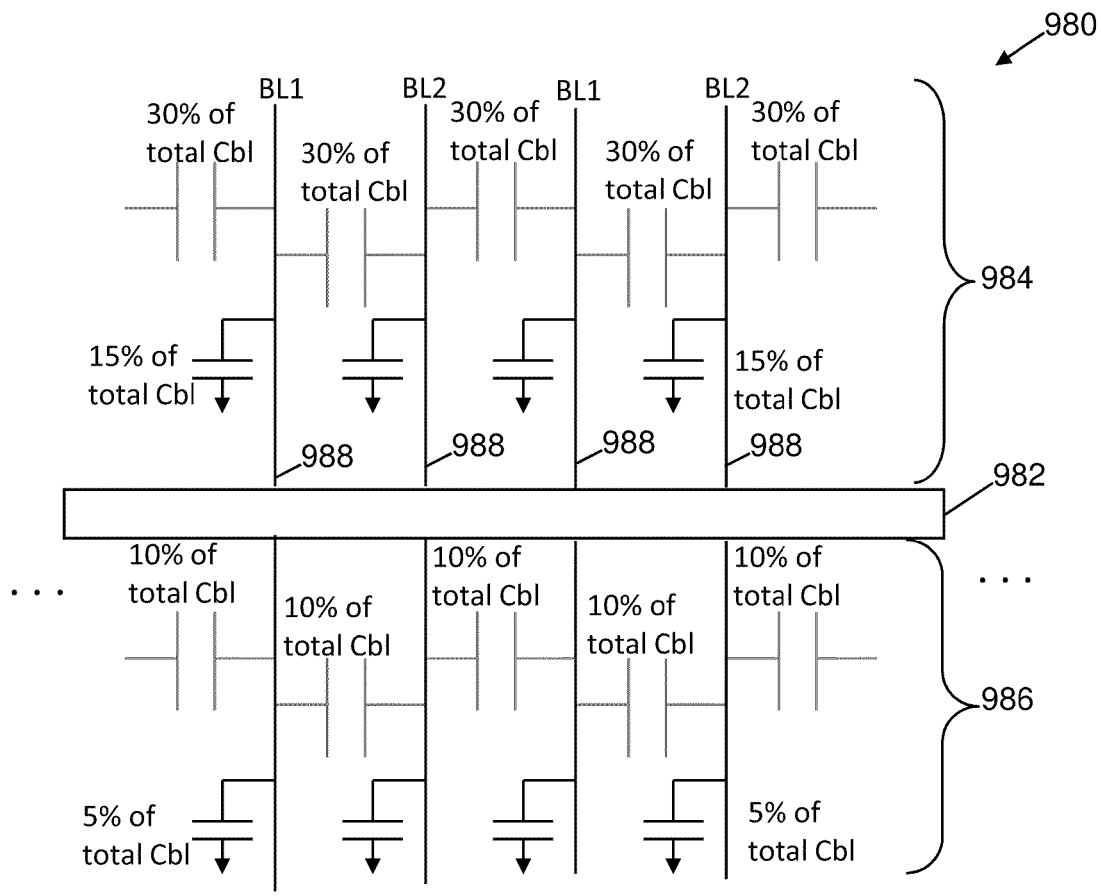
FIG. 11 is a schematic diagram corresponding to FIG. 4 for estimation purposes according to one embodiment.

When the method 200 is replicated across multiple bitlines, the capacitive coupling responsible for the boosted voltage from box 210 may be increased if bitline BL1 has two adjacent bitlines that are raised to substantially a predetermined voltage at 212. The two adjacent bitlines may include bitline BL2 on one side and another bitline on the other side of bitline BL1, as shown in FIGS. 10-11 below.

It is noted that in one embodiment of method 200, bitlines BL1 and BL2 may be switched with each other. For example, if the voltages of both bitlines BL1 and BL2 are to be equalized, it may not matter whether bitline BL1 or bitline BL2 is floated because both bitlines BL1 and BL2 will equalize to an intermediate value.

In one embodiment, method 200 may not use equalize phase 214. Thus, a higher voltage may be left on a bitline that may need it. For example, an inhibited bitline that is surrounded by two bitlines selected for programming may have the worst case for boosting. Because the memory cells of the bitlines being programmed have grounded bitlines, the grounded potentials couple over to the boosted region, thus lowering the boosted voltage on a string coupled to the inhibited bitline. In one embodiment, the higher voltage may be left on bitline BL2. This may be achieved if bitlines BL1 and BL2 switch with each other.

Further, it is noted that in one embodiment, method 200 is not necessarily limited to the order in which the boxes are presented. For example, some boxes may occur before, after, or concurrently with other boxes. In method 200, box 210, floating bitline BL1, and box 212, ramping bitline BL2 to substantially predetermined voltage, may occur contemporaneously. Bitline BL1 is floated until bitline BL2 reaches substantially a predetermined voltage. In another example, raising SGD voltage at box 220 may occur before ramping bitline BL2 to substantially a predetermined voltage at 212 is completed. It is further noted that in method 200, one or more boxes of method 200 may be optional and/or may occur more than once. The scope of the claimed subject matter is not limited in these respects.

Figure 3A:
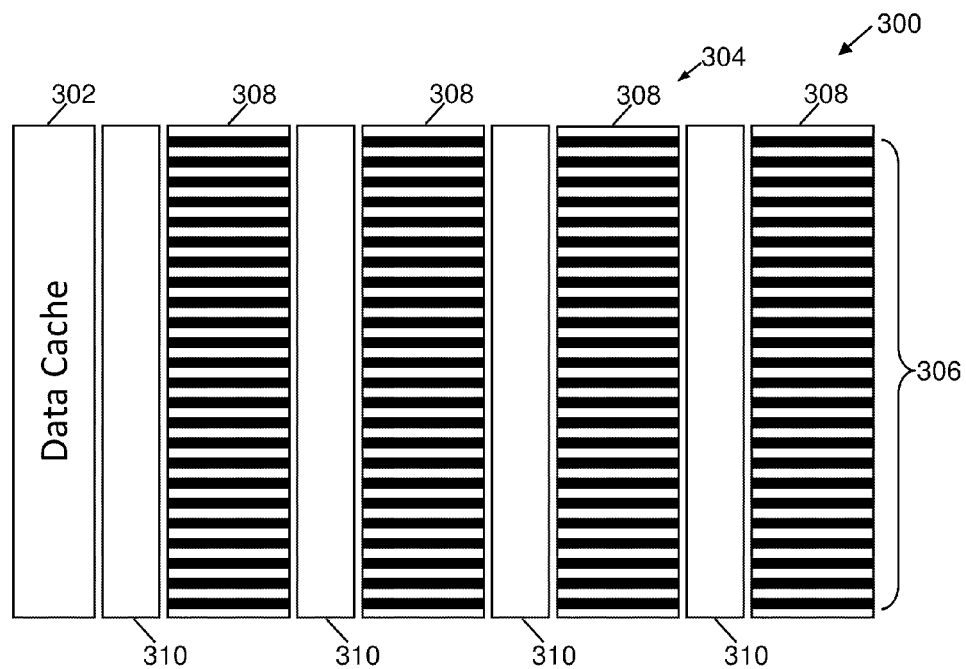
FIG. 3A is a simplified block diagram of a non-volatile memory device according to one embodiment.

In FIG. 3A, a simplified block diagram of a non-volatile memory device 300 is shown according to one embodiment. Memory device 300 may include a data cache 302 coupled to a memory array 304 with bitlines 306 including one or more segments 308. Memory device 300 may further include one or more segment data handlers 310 capable of separating segments 308 and controlling voltages applied to segments 308.

Figure 3B:
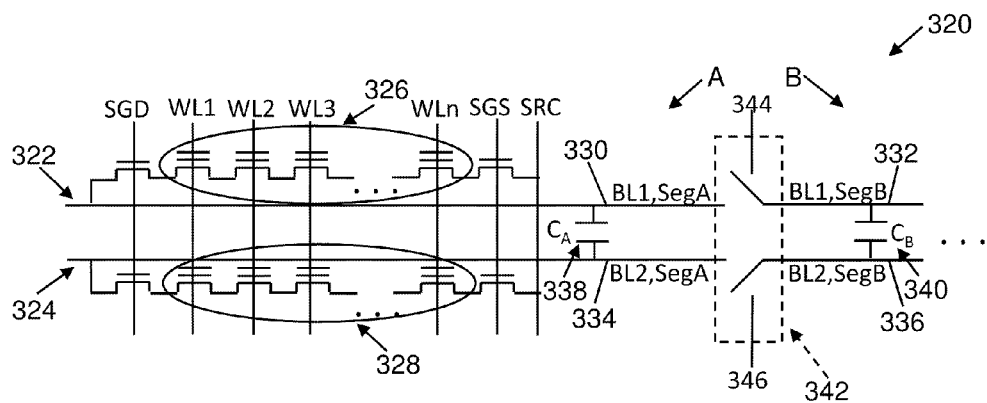
FIG. 3B is a schematic diagram of an exemplary portion of two adjacent bitlines of FIG. 3A according to one embodiment.

Referring now to FIG. 3B, a schematic diagram of an exemplary portion of bitlines 306 of memory array 304 of FIG. 3A is shown at 320. Similar to FIG. 1A, FIG. 3B shows two adjacent bitlines 322 (herein referred to as "BL1") and 324 (herein referred to as "BL2") capable of accessing data in strings 326 and 328 of memory cells, respectively. FIG. 3B further shows segments A and B of bitlines BL1 and BL2, not necessarily depicted in their entirety. "BL1,SegA" is herein used to refer to segment A of bitline BL1 (labeled 330). Similarly, "BL1,SegB" refers to segment B of bitline BL1 (labeled 332), "BL2,SegA" refers to segment A of bitline BL2 (labeled 334), and "BL2,SegB" refers to segment B of bitline BL2 (labeled 336). Segments BL1,SegA, BL1,SegB, BL2,SegA, and BL2,SegB may include additional strings and segments.

Adjacent segments BL1,SegA and BL2,SegA may be capacitively coupled as indicated by capacitance 338. Likewise, adjacent segments BL1,SegB and BL2,SegB may be capacitively coupled as indicated by capacitance 340.

Between segments A and B of bitlines BL1 and BL2 is a segment data handler 342 capable of coupling segments B to segments A, floating segments B, or coupling segments B to a predetermined voltage (such as ground, Vcc, or other preset voltage). A predetermined voltage may be applied to BL1 at 344 and a predetermined voltage (same or different from that of 344) may be applied to BL2 at 346. In FIG. 3B, segment data handler 342 is depicted with a schematic representation of underlying circuitry, but more details are provided in an example shown in FIG. 9 below. Further, another segment data handler (not shown) similar to segment data handler 342 may be coupled to segments A of bitlines BL1 and BL2.

In one embodiment, one of bitlines BL1 or BL2 may not be segmented. The non-segmented bitline may be capacitively coupled to one or more segments of the segmented bitline.

Figure 3C:
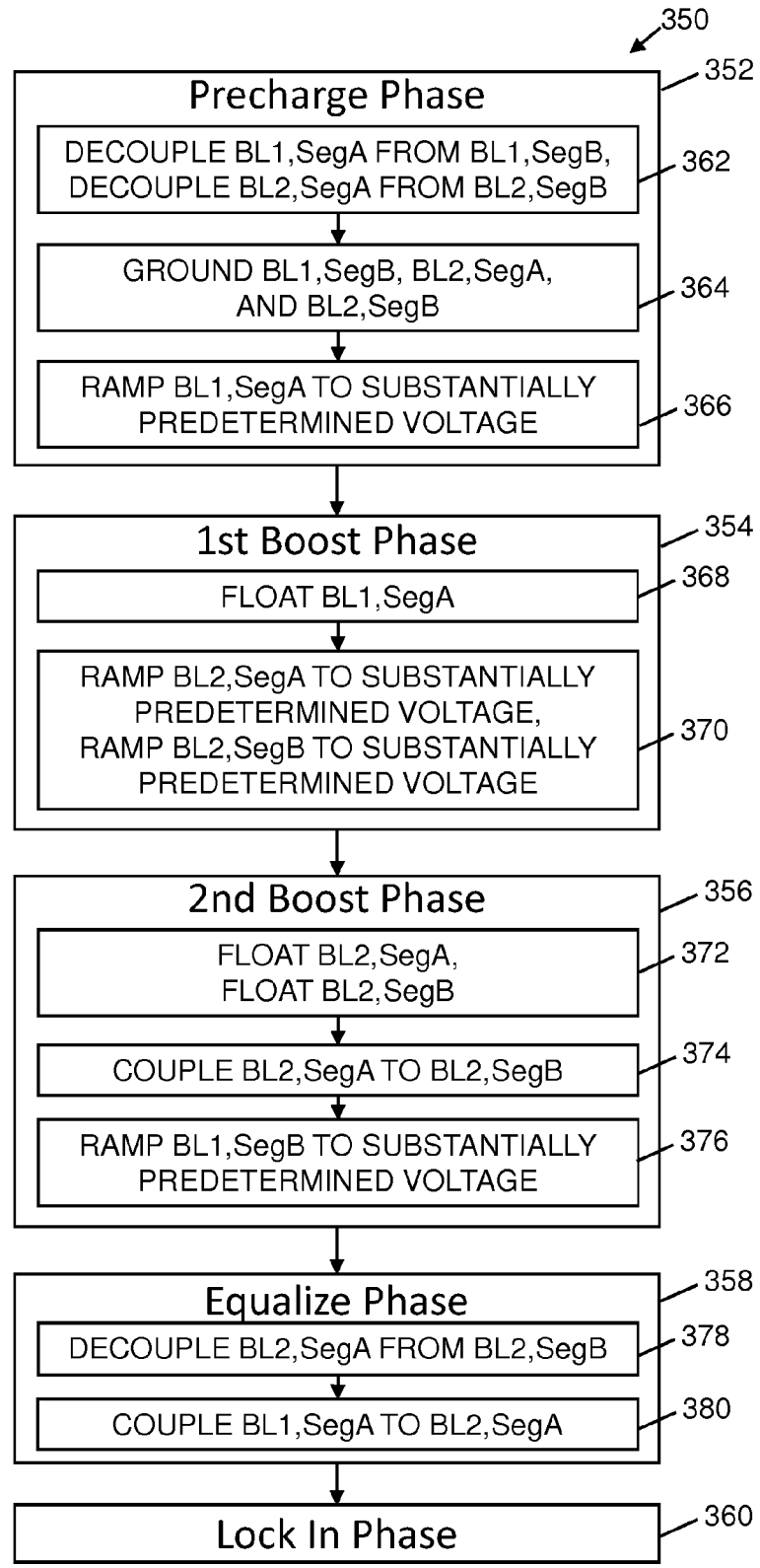
FIG. 3C is a flowchart of a method for use in a non-volatile memory device according to one embodiment.

Referring to FIG. 3C, a flowchart of a method 350 for use in memory device 300 according to one embodiment is shown. Method 350 may include a precharge phase 352, a first boost phase 354, a second boost phase 356, an equalize phase 358, and a lock-in phase 360. In one embodiment, FIGS. 4-7 below further depict and describe phases 352, 354, 356, and 358. FIG. 8 below summarizes the voltage levels during phases 352, 354, 356, and 358 according to one embodiment. The scope of the claimed subject matter is not limited to what is shown in these figures.

Precharge phase 352 may include, at 362, decoupling segment BL1,SegA from segment BL1,SegB, and decoupling segment BL2,SegA from segment BL2,SegB. At 364, precharge phase 352 may include grounding segments BL1,SegB, BL2,SegA, and BL2,SegB. At 366, precharge phase 352 may further include ramping bitline BL1,SegA to substantially a predetermined voltage.

At 354, the first boost phase may include, at 368, floating segment BL1,SegA. Floating a segment herein may involve decoupling the segment from a predetermined voltage (such as ground, Vcc, or other preset voltage). First boost phase 354 may further include, at 370, ramping segment BL2,SegA to substantially a predetermined voltage, and ramping segment BL2,SegB to substantially a predetermined voltage.

The second boost phase 356 may include, at 372, floating segment BL2,SegA, and floating segment BL2,SegB. At 374, second boost phase 356 may include coupling segment BL2,SegB to segment BL2,SegA. At 376, the second boost phase 356 may include ramping segment BL1,SegB to substantially a predetermined voltage.

At 378, equalize phase 358 may include decoupling segment BL2,SegA from segment BL2,SegB. Equalize phase 358 may further include, at 380, coupling segment BL2,SegA with segment BL1,SegA to allow for segments BL1,SegA and BL2,SegA to share charge. At 360, the lock-in phase is similar to that which is shown and described in box 218 of FIG. 2. Lock-in may occur in strings of segments BL1,SegA, BL1,SegB, BL2,SegA, and/or BL2,SegB. In one embodiment, a twice-boosted voltage is locked in as a seed voltage in segment BL1,SegA.

Similar to method 200, method 350 is not necessarily limited to the order in which the boxes are presented. One or more boxes of method 350 may be optional and/or occur more than once. The scope of the claimed subject matter is not limited in these respects.

Turning to FIGS. 4-7, the figures are simplified block diagrams of a non-volatile memory device 400 corresponding to one or more phases of method 350. Similar to memory devices 100 and 300, memory device 400 may include a data cache 402 coupled to a memory array 404 including bitlines 406 with programmable memory cells (not shown). Bitlines 406 may be arranged in alternating odd parity and even parity, similar to what was described above. Bitlines 406 are further described below in the context of segments.

The bitlines 406 of memory array 404 may be further arranged in one or more segments. For example, as depicted in FIGS. 4-7, the bitlines 406 are divided into segments 408, 410, 412, and 414. In one embodiment, the bitlines 406 may include 4, 8, or any feasible number of segments.

The segments as shown in FIGS. 4-7 may span one or more blocks (not shown). For example, memory device 400 may include 2048 blocks with segments 408, 410, 412, and 414 each including 512 blocks. Data may be programmed page by page into the memory array 404. Pages of data may be loaded into the data cache 402 for programming or reading. There may be 64 pages of data in each block. It should be noted that memory device 400 may differ in structure and size, and the claimed subject matter is not limited in these respects.

One or more segments may be coupled with a segment data handler capable of selecting a segment and/or control other aspects of the segment. For example, segment data handlers 416, 418, 420, and 422 are coupled with segments 408, 410, 412, and 414, respectively. In this embodiment, segment data handlers 418, 420, and 422 are also coupled with segments 408, 410, and 412, respectively. As an example, segment data handler 418 may bring segment 410 to Vcc, ground, or other predetermined voltage. As another example, the structure of segment data handler 422 is shown and described below in FIG. 9.

Figure 4:
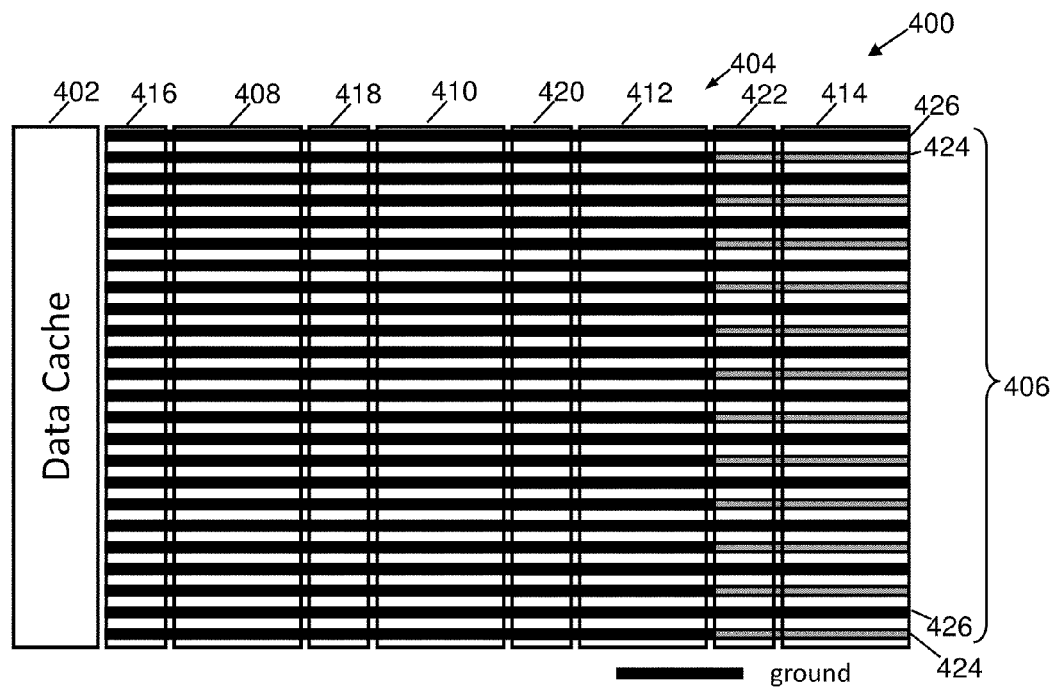
FIG. 4 is a simplified block diagram of a non-volatile memory device in a precharge phase according to one embodiment.
Figure 5:
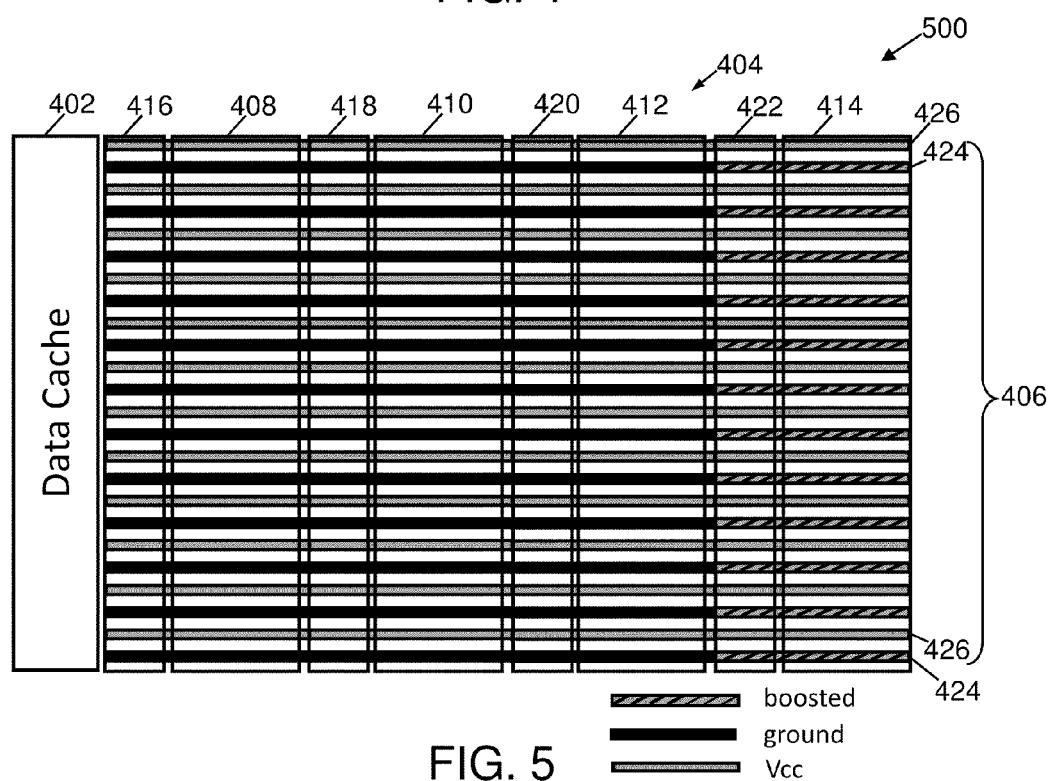
FIG. 5 is a simplified block diagram of a non-volatile memory device in a first boost phase according to one embodiment.
Figure 6:
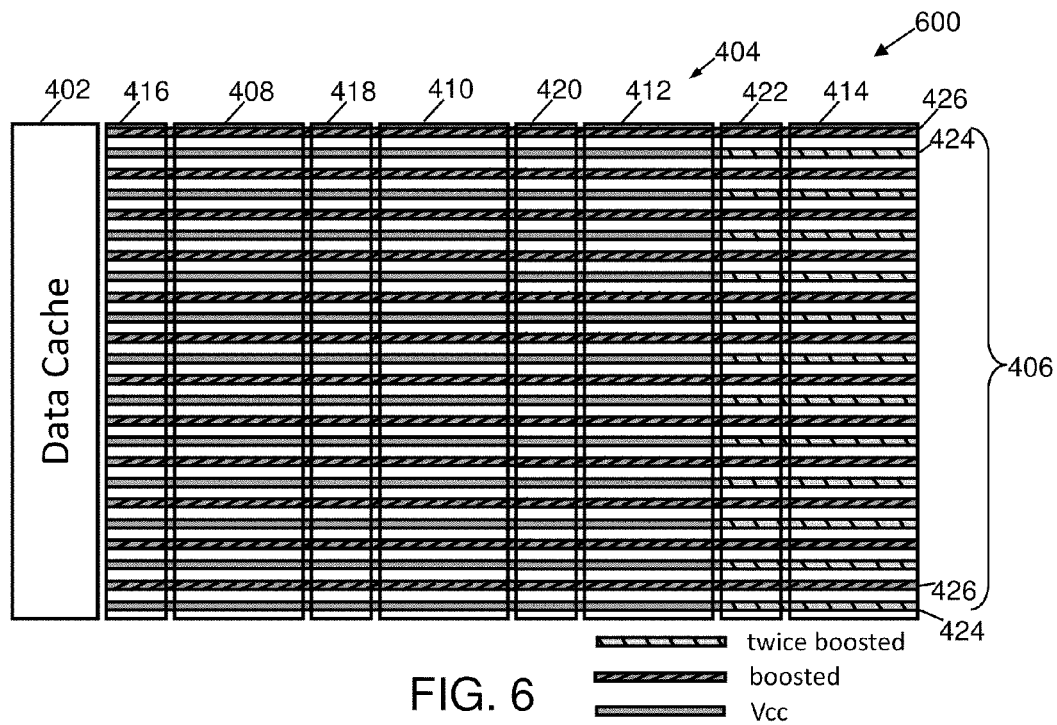
FIG. 6 is a simplified block diagram of a non-volatile memory device in a second boost phase according to one embodiment.
Figure 7:
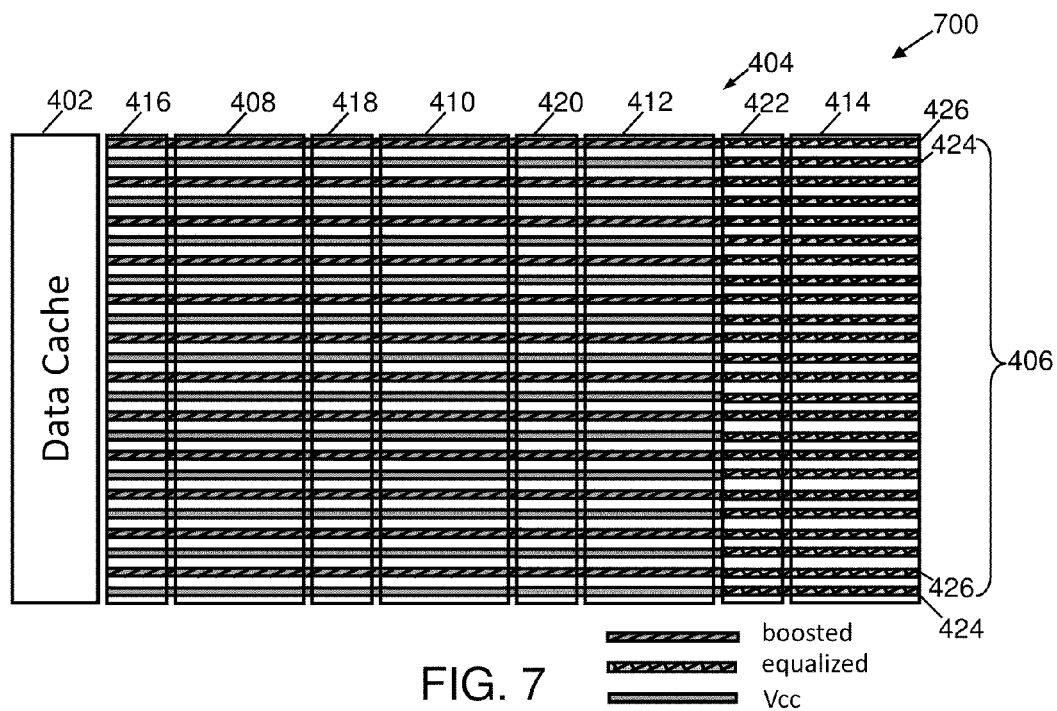
FIG. 7 is a simplified block diagram of a non-volatile memory device in an equalize phase according to one embodiment.
Figures 8, 9:
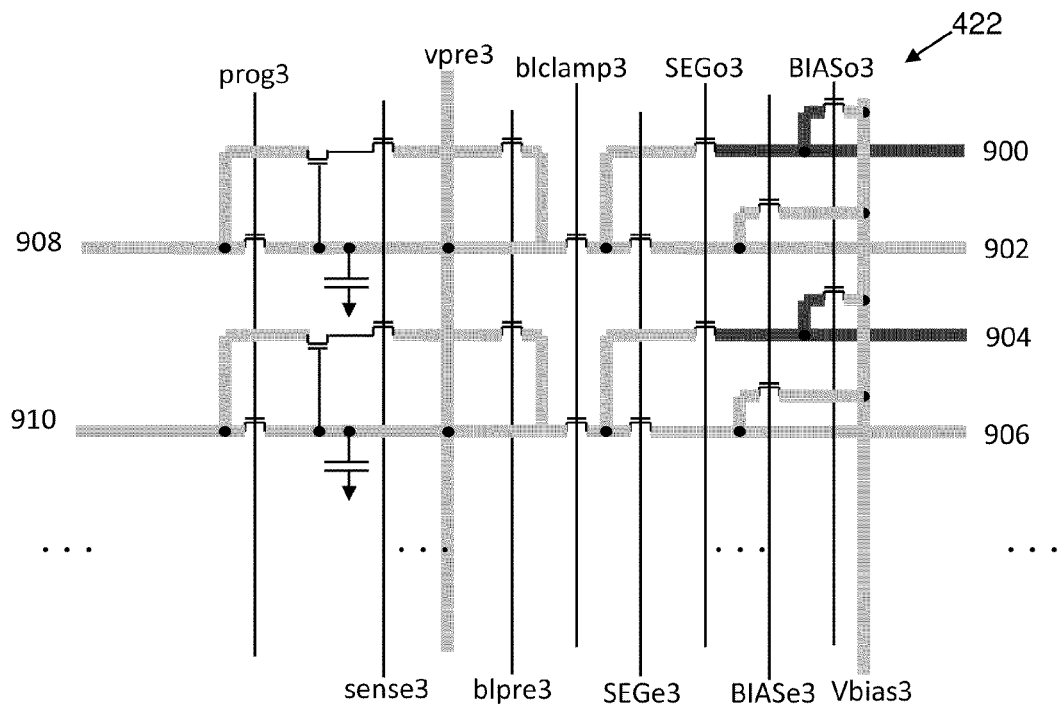
FIG. 8 is a chart summarizing voltage levels of four different segments at various phases of a method according to one embodiment.
FIG. 9 is a circuit diagram of a segment data handler according to one embodiment.

According to one embodiment, FIG. 4 shows the memory device 400 in a precharge phase, FIG. 5 depicts the memory device 400 in a first boost phase 500, FIG. 6 depicts a second boost phase 600, and FIG. 7 shows an equalize phase 700. These figures show segments of bitlines 406 in the memory array 404. The segments may have been charged to a predetermined voltage (for example, Vcc), grounded, boosted, twice boosted, or equalized during one or more phases. It is noted that Vcc is used herein as an example of the predetermined voltage, but the claimed subject matter is not limited to this value. For illustrative purposes, the bitlines 406 are shaded or patterned in accordance with a legend indicating a voltage state in FIGS. 4-7.

"Segments BL1,SegA" is herein used to refer to segments 414 of bitlines 424 of memory array 404. Similarly, "segments BL1,SegB" refers to one or more of segments 408, 410, 412 of bitlines 424, "segments BL2,SegA" refers to segments 414 of bitlines 426, and "segments BL2,SegB" refers to one or more of segments 408, 410, 412 of bitlines 426.

During the precharge phase in FIG. 4, segments BL1,SegA are locally precharged by segment data handler 422 and segments BL2,SegA are grounded by segment data handler 422. Segments BL1,SegB and BL2,SegB are grounded by one or more of segment data handlers 416, 418, and 420. Segments BL1,SegA are raised to substantially a predetermined voltage. In this embodiment, the predetermined voltage may be Vcc.

In FIG. 5, the first boost phase of memory device 400 is shown at 500. Segment data handler 422 floats segments BL1,SegA. Segments BL1,SegB are left at ground by segment data handlers 416, 418, and 420. Segments BL2,SegA and BL2,SegB are ramped up to Vcc. Segments BL1,SegA are boosted up by bitline-bitline capacitance from adjacency to segments BL2,SegA.

FIG. 6 depicts what occurs during the second boost phase in memory device 400 at 600. One or more segment data handlers 416, 418, 420, and 422 float segments BL2,SegA and BL2,SegB. Segments BL1,SegB are raised to Vcc by one or more segment data handlers 416, 418, and 420. The bitline-bitline coupling with adjacent segments BL1,SegA and BL1,SegB boosts the voltage of segments BL2,SegA and BL2,SegB.

As segments BL1,SegA were previously boosted as shown in FIG. 5, segments BL1,SegA are boosted a second time by bitline-bitline coupling with adjacent segments. In the second boost phase, the bitline-bitline capacitance from segments BL2,SegA and BL1,SegA may cause an additional voltage increase in segments BL1,SegA. This second voltage increase may also be referred to as being "twice boosted".

At 700, FIG. 7 illustrates the equalize phase 358 of method 350 in memory device 400. The segment data handler 422 separates segments BL1,SegB from segments BL1,SegA and segments BL2,SegB from segments BL2,SegB. Segments BL1,SegA and BL2,SegA are equalized. Equalization may occur by coupling segments BL1,SegA with BL2,SegA to share charge. In one embodiment, equalization may result in an intermediate voltage greater than Vcc in both segments BL1,SegA and BL2,SegA.

As mentioned above, equalization may not be needed. For example, in one embodiment in which a greater voltage on a particular segment is desired, the equalize phase 700 may be skipped. Depending on design considerations, a greater voltage may be chosen to be left on segments BL1,SegA or segments BL2,SegA. The voltage may further be seeded into channel/source/drain regions and locked in.

FIG. 8 is a chart summarizing voltage levels of four different segments at various phases of a method 350 according to one embodiment shown in FIGS. 4-7. The four different segments include BL1,SegA 802, BL2,SegA 804, BL1,SegB 806, and BL2,SegB 808. Segments BL1,SegA 802 includes segments 414 of bitlines 424, segments BL2,SegA 804 includes segments 414 of bitlines 426, segments BL1,SegB 806 includes one or more segments 408, 410, and 412 of bitlines 424, and segments BL2,SegB 808 includes one or more segments 408, 410, and 412 of bitlines 426.

As described above, method 350 may include precharge phase 352, first boost phase 354, second boost phase 356, equalize phase 358, and lock-in phase 360. A precharge phase 810 corresponds to the precharge phase 352, a first boost phase 820 corresponds to the first boost phase 354, a second boost phase 830 corresponds to the second boost phase 356, and an equalize phase 840 corresponds to the equalize phase 358.

During precharge phase 810, segments BL2,SegA 804, BL1,SegB 806, and BL2,SegB 808 are grounded as shown in boxes 814, 816, and 818, respectively. At box 812, segments BL1,Seg1 802 are at Vcc. In the first boost phase 820, segments BL1,SegA 802 are boosted, at box 822. Segments BL2,SegA 804 and BL2,SegB 808 are at Vcc, at boxes 824 and 828, respectively. Segments BL1,SegB 806 are left at ground, at box 826.

During the second boost phase 830, at box 832, segments BL1,SegA 802 are twice boosted, and at boxes 834 and 838, respective segments BL2,SegA 804 and BL2,SegB 808 are boosted. At box 836, segments BL1,SegB 806 are at Vcc.

In the equalize phase 840, segments BL1,SegA 802 and BL2,SegA 804 are equalized by coupling to each another, at respective boxes 842 and 844. Segments BL1,SegB 806 and BL2,SegB 808 are at Vcc, ground, or other predetermined voltage, at respective boxes 846 and 848. The determination of whether the segments BL1,SegB 806 and BL2,SegB 808 are at Vcc, ground, or other predetermined voltage may be determined by the data cache 402 which has information regarding whether the bitlines (or segments within) are being programmed. If the data cache 402 determines that the bitlines are to be inhibited (not programmed), a voltage of Vcc or higher is placed on the bitlines. Otherwise, the bitlines are grounded to program selected memory cells.

According to one embodiment, a sequence between segments BL1,SegA 802 and BL2,SegA 804 may be reversed since the segments will be equalized. For example, boxes 812 and 814 may be switched during the precharge phase 810, boxes 822 and 824 may be switched during the first boost phase 820, and boxes 832 and 834 may be switched during the second boost phase 830. The equalize phase 840 will equalize BL1,SegA 802 and BL2,SegA 804 such that the segments will have substantially the same intermediate voltage. In one embodiment, the equalize phase 840 may be skipped and either of segments BL1,SegA 802 or BL2,SegA 804 are left with a higher voltage.

FIG. 9 is a circuit diagram of segment data handler 422 according to one embodiment. Segment data handler 422 may include circuitry capable of receiving signals, such as prog3, sense3, vpre3, etc., from controllers and other devices. Segment data handler 422 may further be capable of allowing voltage flow to and from segment 414 of the memory array 404. It is noted that segment data handler 422 may vary structurally from that pictured in FIG. 9 and may include additional components.

Segment data handlers 416, 418, and 420 may have a structure similar to or identical to segment data handler 422. Similarly, segment data handlers 416, 418, and 420 may be capable of controlling voltage to and from segments 408, 410, and 412, respectively. In one embodiment, segment data handlers 416, 418, 420, and 422 may include circuitry capable of handling of precharging and boosting the voltage of one or more segments BL1,SegA, BL1,SegB, BL2SegA, and BL2SegB. The circuitry may further be capable of handling of boosting the voltage of one or more segments a second time.

As an example, FIG. 9 shows a portion of segment data handler 422 during first boost phase 354. Signal line vpre3 drives bitlines 902 and 906 of segment 414 to Vcc. Bitlines 902 and 904 of segment 414 are floated and boosted by bitline-bitline coupling. Segment data handler 422 couples bitlines 902 and 900 of segment 414 to bitline 908 of segment 412, and bitlines 906 and 904 of segment 414 to bitline 910 of segment 412.

Referring to FIG. 10, a schematic diagram corresponding to a portion of the memory array structure of FIG. 1 is shown at 970. The schematic diagram 970 is a simplified depiction for estimation purposes only according to one embodiment. Bitlines 972 are illustrated running vertically with capacitance estimated to be approximately 20%. Bitlines 972 are coupled to adjacent bitlines in which the bitline-bitline capacitance is estimated to be approximately 40%. The boosted level of a boost phase such as 204 of FIG. 2 is:

$$(40\% + 40\%)/100\% \times Vcc + Vcc = 180\% \times Vcc$$

in which the underlined portion of the equation represents the contribution from adjacent bitlines per total bitline capacitance.

It is estimated that from the equalize phase for a single-boost method, such as shown in FIG. 2, the equalized level is:

$$(180\% \times Vcc + Vcc)/2 = 140\% \times Vcc.$$

FIG. 11 is a schematic diagram 980 corresponding to a portion of the memory array structure of FIG. 4, simplified for estimation purposes only according to one embodiment. Diagram 980 shows a switch 982 that may be used to separate a first segment 984 from a second segment 986. Segment data handler 422 of FIG. 9 is an example of switch 982.

Bitlines 988 are illustrated running vertically with capacitance estimated to be approximately 20%. Bitlines 988 are coupled to adjacent bitlines where the bitline-bitline capacitance is estimated to be approximately 40%. In this estimate, it is assumed that a whole bitline is divided into 4 segments with identical capacitance. The first segment 984 is estimated to have capacitance of approximately 15% and bitline-bitline capacitance of approximately 30%. The second segments 986 are estimated to have capacitance of approximately 5% and bitline-bitline capacitance of approximately 10%.

The boosted level of a first boost phase, such as shown in FIG. 5, is:

$$(10\% + 10\%)/(10\% + 10\% + 5\%) \times Vcc + Vcc = 180\% \times Vcc.$$

in which the underlined portion of the equation represents the contribution from adjacent bitlines per total bitline capacitance of segment 986.

The boosted level of a second boost phase, such as depicted in FIG. 6, is:

$$(30\% + 30\%)/(30\% + 30\% + 15\% + 5\%) \times Vcc + Vcc = 175\% \times Vcc.$$

in which the underlined portion of the equation represents the contribution from adjacent bitlines per total bitline capacitance of first segment 984 excluding bitline-bitline capacitance of second segment 986.

A twice-boosted level of second boost phase may be estimated as:

$$(180\% - 100\%) \times Vcc + 175\% \times Vcc = 255\% \times Vcc.$$

It is estimated that from the equalize phase, the equalized level is:

$$(175\% \times Vcc + 255\% \times Vcc)/2 = 215\% \times Vcc$$

From these estimates, it is shown that boosting by use of bitline-bitline capacitance may increase the boosting level. It should be noted that in one embodiment without equalization, a bitline may be boosted to approximately 175% of Vcc and an adjacent bitline may be boosted to approximately 255% of Vcc. This may be a design consideration, for example, when an inhibited bitline is surrounded by programmed bitlines and has a lower boost ratio. It is noted that the scope of the claimed subject matter is not limited to these estimated values.

It is appreciated that boosting seed voltage in a memory device has been explained with reference to one or more exemplary embodiments, and that the claimed subject matter is not limited to the specific details given above. References in the specification made to other embodiments fall within the scope of the claimed subject matter.

Any reference to device may include a component, circuit, module, or any such mechanism in which the device can achieve the purpose or description as indicated by the modifier preceding the device. However, the component, circuit, module, or any such mechanism is not necessarily a specific limitation to the device.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the claimed subject matter. Indeed, the claimed subject matter is not limited to the details described above. Rather, it is the following claims including any amendments thereto that define such scope and variations.

What is claimed is:

1. A method for boosting seed voltage in a memory device, the method comprising:
grounding a first bitline;
ramping up a voltage of a second bitline to substantially a predetermined voltage, the second bitline being adjacent to and being capacitively coupled with the first bitline;
floating the second bitline;
ramping up a voltage of the first bitline to substantially the predetermined voltage;
locking in a seed voltage by raising a select gate drain (SGD) voltage to at least a voltage sufficiently high to allow an SGD device coupled to the second bitline to pass the SGD voltage from a drain of the SGD device to a source of the SGD device, and lowering the SGD voltage to at most a voltage sufficiently low to prevent the SGD device from pulling down a voltage of a string coupled to the SGD device if the voltage of the second bitline voltage is lowered from a boosted value or an intermediate value.

2. The method of claim 1, further comprising coupling the first bitline with the second bitline to share charge.

3. The method of claim 1, wherein the first bitline comprises a first segment and a second segment, and the second bitline comprises a first segment and a second segment.

4. The method of claim 3, wherein said grounding a first bitline; and said ramping up a voltage of a second bitline comprises precharging the first segment of the second bitline; and further comprising grounding the second segment of the second bitline.

5. The method of claim 4, wherein said floating the second bitline comprises floating the first segment of the second bitline, and further comprising leaving the second segment of the second bitline at ground.

6. The method of claim 5, further comprising floating the first segment and the second segment of the first bitline; and ramping up a voltage of the second segment of the second bitline to substantially the predetermined voltage, wherein the first segment and the second segment of the first bitline is boosted, and the first segment of the second bitline is boosted a second time.

7. The method of claim 6, further comprising coupling the first segment of the second bitline with the first segment of the first bitline to share charge.

8. The method of claim 6, further comprising locking in a seed voltage.

9. A non-volatile memory device, comprising:

a data cache coupled to a memory array;

one or more adjacent bitlines in the memory array, said one or more adjacent bitlines being divided into two or more segments; and one or more segment data handlers coupled with said two or more segments, said two or more segment data handlers comprising circuitry capable of handling of precharging said two or more segments and of boosting the voltage of said two or more segments by using bitline-bitline capacitance.

10. The device of claim 9, wherein said two or more segment data handlers are further capable of coupling said two or more segments to another one of said two or more segments.

11. The device of claim 9, wherein said two or more adjacent bitlines comprise four segments or eight segments.

12. The device of claim 9, wherein said two or more adjacent bitlines comprise odd bitlines and even bitlines arranged alternately.

13. The device of claim 9, wherein the circuitry is further capable of handling of boosting the voltage of said two or more segments a second time.

14. A method for boosting seed voltage in a non-volatile memory device, the method comprising:

in a precharge phase, grounding a first segment and a second segment of a first bitline and a first segment of a second bitline;

ramping the second segment of the second bitline to substantially a predetermined voltage;

in a first boost phase, floating the second segment of the second bitline;

ramping the first segment and the second segment of the first bitline to substantially the predetermined voltage;

in a second boost phase, floating the first segment and the second segment of the first bitline; and ramping the first segment of the second bitline to substantially the predetermined voltage.

15. The method of claim 14, further comprising, in an equalize phase, coupling the second segment of the second bitline with the second segment of the first bitline to share charge.

16. The method of claim 14, further comprising, in a lock-in phase, locking in a seed voltage.

17. The method of claim 14, wherein the second segment of the second bitline is twice boosted.

18. The method of claim 14, wherein the first bitline is adjacent to the second bitline in the memory device.

* * * * *